United States Patent
Osada et al.

(10) Patent No.: US 6,894,091 B2
(45) Date of Patent: May 17, 2005

(54) SEMICONDUCTOR ENCAPSULATING EPOXY RESIN COMPOSITION AND SEMICONDUCTOR DEVICE

(75) Inventors: Shoichi Osada, Gunma-ken (JP); Toshio Shiobara, Gunma-ken (JP); Eiichi Asano, Gunma-ken (JP); Kazutoshi Tomiyoshi, Gunma-ken (JP); Takayuki Aoki, Gunma-ken (JP); Shigeki Ino, Gunma-ken (JP)

(73) Assignee: Shin Etsu Chemical Co., Ltd., Tokyo (JP)

( * ) Notice: Subject to any disclaimer, the term of this patent is extended or adjusted under 35 U.S.C. 154(b) by 376 days.

(21) Appl. No.: 09/883,276

(22) Filed: Jun. 19, 2001

(65) Prior Publication Data

US 2002/0016398 A1 Feb. 7, 2002

(30) Foreign Application Priority Data

Jun. 19, 2000 (JP) .................................... 2000-183054

(51) Int. Cl.$^7$ ................................................ C08K 5/00
(52) U.S. Cl. .................... 523/457; 523/458; 528/87; 528/99; 528/210; 528/405; 528/418; 528/420; 528/423

(58) Field of Search ......................... 528/87, 99, 210, 528/405, 418, 420, 423; 523/458

(56) References Cited

U.S. PATENT DOCUMENTS 6,190,787 B1 * 2/2001 Maeda et al. ................ 428/620
6,214,455 B1 * 4/2001 Honda et al. ............. 428/299.4

FOREIGN PATENT DOCUMENTS

JP          10324791 A  * 12/1998  ........... C08L/63/00

* cited by examiner

*Primary Examiner*—Margaret G. Moore
*Assistant Examiner*—Marc S. Zimmer
(74) *Attorney, Agent, or Firm*—Birch, Stewart, Kolasch & Birch, LLP.

(57) ABSTRACT

A semiconductor encapsulating epoxy resin composition comprising (A) an epoxy resin, (B) a phenolic resin curing agent, (C) a molybdenum compound, and (D) 300–900 parts by weight per 100 parts by weight of components (A) and (B) combined of an inorganic filler contains nitrogen atoms in an amount of 1.5–20% by weight based on the weight of components (A) and (B) combined. Cured parts of the composition exhibit high-temperature capabilities and flame retardance despite the absence of halogenated epoxy resins and antimony trioxide.

13 Claims, No Drawings

SEMICONDUCTOR ENCAPSULATING EPOXY RESIN COMPOSITION AND SEMICONDUCTOR DEVICE

This invention relates to an epoxy resin composition for semiconductor encapsulation which cures into a product having improved flame retardance and high-temperature capabilities while it is free of halogenated epoxy resins and antimony compounds. It also relates to a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. Semiconductor devices are now used in every area of the modern society, for example, in electric appliances and computers. As a guard against accidental fire, the semiconductor encapsulating materials are required to be flame retardant.

In prior art epoxy resin compositions, halogenated epoxy resins combined with antimony trioxide ($Sb_2O_3$) are often blended in order to enhance flame retardance. This combination of a halogenated epoxy resin with antimony trioxide has great radical-trapping and air-shielding effects in the vapor phase, thus conferring a high fire-retarding effect.

In a high-temperature environment, however, such flame retardants as halides and antimony oxide are decomposed to give rise to chemical reaction at connections between gold wires and aluminum lines. This results in an increased resistance at the connections or even disconnection, inviting malfunction. In addition, the halogenated epoxy resins generate noxious gases during combustion, and antimony trioxide has powder toxicity. Given their negative impact on human health and the environment, it is desirable to entirely exclude these fire retardants from resin compositions.

In view of the above demand, studies have been conducted on the use of hydroxides such as $Al(OH)_3$ and $Mg(OH)_2$ or phosphorus-containing fire retardants in place of halogenated epoxy resins and antimony trioxide. Unfortunately, because of various problems associated with the use of these alternative compounds, such as inferior curability of the resin composition during molding and poor moisture resistance in the cured product, they are not yet ready for practical application.

SUMMARY OF THE INVENTION

An object of the invention is to provide an epoxy resin composition for semiconductor encapsulation which is free of halogenated epoxy resins and antimony compounds such as antimony trioxide, and exhibits improved flame retardance and high-temperature capabilities. Another object is to provide a semiconductor device encapsulated with the composition in the cured state.

It has been found that an epoxy resin composition comprising (A) an epoxy resin, (B) a phenolic resin curing agent, (C) a molybdenum compound, and (D) an inorganic filler as essential components, when it contains nitrogen atoms in component (A) and/or component (B) in an amount of 1.5 to 20% by weight based on the weight of components (A) and (B) combined, cures into parts exhibiting improved high-temperature capabilities and flame retardance despite the absence of halogenated epoxy resins and antimony compounds such as antimony trioxide.

Accordingly, the invention provides a semiconductor encapsulating epoxy resin composition comprising (A) an epoxy resin, (B) a phenolic resin curing agent, (C) a molybdenum compound, and (D) 300 to 900 parts by weight per 100 parts by weight of components (A) and (B) combined of an inorganic filler, wherein nitrogen atoms are contained in component (A) and/or component (B) in an amount of 1.5 to 20% by weight based on the weight of components (A) and (B) combined.

Also contemplated herein is a semiconductor device encapsulated with a cured product of the epoxy resin composition defined above.

DETAILED DESCRIPTION OF THE INVENTION

The epoxy resin (A) is selected from known epoxy resins having at least two epoxy groups per molecule. Illustrative examples of suitable epoxy resins include novolac-type epoxy resins such as phenolic novolac epoxy resins and cresol novolac epoxy resins, triphenolalkane epoxy resins, phenolaralkyl epoxy resins, biphenyl skeleton-containing aralkyl epoxy resins, biphenyl epoxy resins, heterocyclic epoxy resins, naphthalene ring-containing epoxy resins, bisphenol-type epoxy resins such as bisphenol A epoxy resins and bisphenol F epoxy resins, and stilbene epoxy resins as well as epoxy resins containing nitrogen atoms in the resin skeleton in the form of a triazine ring structure such as a melamine skeleton, guanamine skeleton or cyanurate skeleton, as shown by the following formulas (1), (2) and (3). Any one or combination of two or more of these epoxy resins may be employed. It is noted that the epoxy resin containing nitrogen atoms in its skeleton is not limited to these examples.

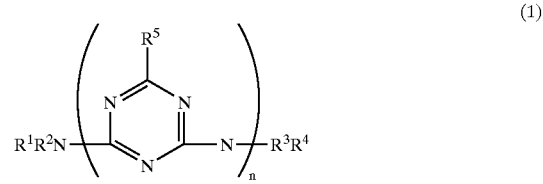

(1)

In formula (1), $R^1$, $R^2$, $R^3$, $R^4$, and $R^5$ are independently selected from the class consisting of hydrogen, an amino group, a monovalent phenyl glycidyl ether residue represented by the formula:

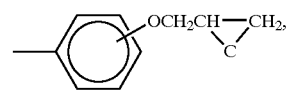

and an epoxy resin having one free valence bond, with the proviso that at least one of $R^1$, $R^2$, $R^3$, $R^4$, and $R^5$ is a monovalent phenyl glycidyl ether residue or an epoxy resin having one free valence bond, and n is an integer of at least 1, preferably 1 to 10, and more preferably 1 to 5.

(2)

In formula (2), $R^6$ and $R^7$ are independently selected from the class consisting of hydrogen, an alkyl group having 1 to 10 carbon atoms, a monovalent phenyl glycidyl ether residue, an epoxy resin having one free valence bond, and a thermoplastic resin having one free valence bond, with the proviso that at least one of $R^6$ and $R^7$ is a monovalent phenyl glycidyl ether residue or an epoxy resin having one free valence bond, and k is an integer of at least 1, usually 1 to 300, preferably 5 to 250, and more preferably 30 to 250.

In formulas (1) and (2), illustrative examples of the epoxy resin having one free valence bond include novolac-type epoxy resins such as phenol novolac epoxy resins and cresol novolac epoxy resins, phenolaralkyl epoxy resins, triphenolalkane epoxy resins, biphenyl skeleton-containing aralkyl epoxy resins, biphenyl epoxy resins, bisphenol-type epoxy resins such as bisphenol A epoxy resins and bisphenol F epoxy resins, alicyclic epoxy resins, heterocyclic epoxy resins, and naphthalene ring-containing epoxy resins, each of which has one free valence bond. Illustrative examples of the thermoplastic resin having one free valence bond include polyether, polyester, polymethyl methacrylate, polystyrene, polybutadiene, and methyl methacrylate-butadiene-styrene copolymers, each of which has one free valence bond.

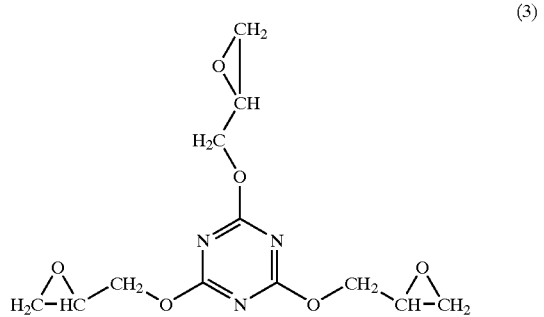

(3)

Illustrative examples of the phenolic resin serving as curing agent (B) include novolac-type phenolic resins such as phenol novolac resins and cresol novolac resins, naphthalene phenolic resins, aralkyl phenolic resins, triphenolalkane phenolic resins, biphenyl skeleton-containing aralkyl phenolic resins, biphenyl phenolic resins, alicyclic phenolic resins, heterocyclic phenolic resins, naphthalene ring-containing phenolic resins, and bisphenol-type phenolic resins such as bisphenol A resins and bisphenol F resins as well as phenolic resins containing nitrogen atoms in the resin skeleton in the form of a triazine ring structure such as a melamine skeleton, guanamine skeleton or cyanurate skeleton, as shown by the following formulas (4), (5) and (6). Any one or combination of two or more of these phenolic resins may be employed. It is noted that the phenolic resin containing nitrogen atoms in its skeleton is not limited to these examples.

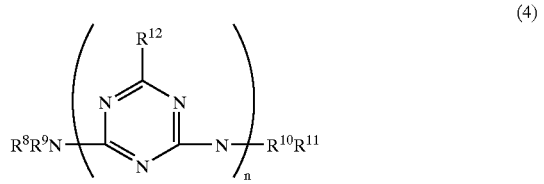

(4)

In formula (4), $R^8$, $R^9$, $R^{10}$, $R^{11}$, and $R^{12}$ are independently selected from the class consisting of hydrogen, an amino group, a monohydric phenol (i.e., o-, m- or p-hydroxyphenyl), and a phenolic resin having one free valence bond, with the proviso that at least one of $R^8$, $R^9$, $R^{10}$, $R^{11}$, and $R^{12}$ is a monohydric phenol or a phenolic resin having one free valence bond, and n is an integer of at least 1, preferably 1 to 10, and more preferably 1 to 5.

(5)

In formula (5), $R^{13}$ and $R^{14}$ are independently selected from the class consisting of hydrogen, an alkyl group having 1 to 10 carbon atoms, a monohydric phenol (i.e., o-, m- or p-hydroxyphenyl), a phenolic resin having one free valence bond, and a thermoplastic resin having one free valence bond, with the proviso that at least one of $R^{13}$ and $R^{14}$ is a monohydric phenol or a phenolic resin having one free valence bond, and k is an integer of at least 1, usually 1 to 300, preferably 5 to 250, and more preferably 30 to 250.

In formulas (4) and (5), illustrative examples of the phenolic resin having one free valence bond include novolac-type phenolic resins such as phenol novolac resins and cresol novolac resins, aralkyl phenolic resins, triphenolalkane phenolic resins, biphenyl skeleton-containing aralkyl phenolic resins, biphenyl phenolic resins, bisphenol-type phenolic resins such as bisphenol A resins and bisphenol F resins, alicyclic phenolic resins, heterocyclic phenolic resins, and naphthalene ring-containing phenolic resins, each of which has one free valence bond. Illustrative examples of the thermoplastic resin having one free valence bond include polyether, polyester, polymethyl methacrylate, polystyrene, polybutadiene, and methyl methacrylate-butadiene-styrene copolymers, each of which has one free valence bond.

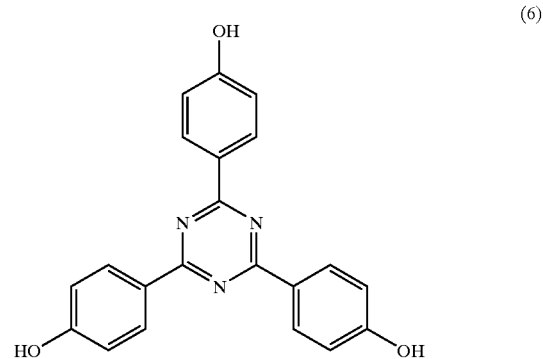

(6)

The amount of the phenolic resin curing agent (B) blended is not critical although it is preferred that the amount of phenolic hydroxyl groups in the phenolic resin curing agent (B) be from 0.5 to 1.4 moles, and especially 0.8 to 1.2 moles, per mole of epoxy groups in the epoxy resin (A).

The majority of nitrogen atoms in the phenolic resin curing agent are present in the form of primary, secondary or tertiary amine and able to react with epoxy groups in the epoxy resin. In general, amines are more reactive than phenolic hydroxyl groups, and reaction is accelerated by higher temperatures. Then, if melting and mixing of the ingredients is performed at higher temperatures, curing reaction can occur during the melting and mixing step. It is therefore crucial that a composition having compounded therein the phenolic resin curing agent containing nitrogen atoms in the resin skeleton be melted and mixed at lower temperatures. In order to control reaction between amine and epoxy, the melting and mixing operation should be conducted at a temperature of up to 120° C., desirably up to 100° C. That is, the epoxy resin and/or phenolic resin curing agent containing nitrogen atoms in the resin skeleton should desirably have a softening point of up to 120° C., especially up to 100° C.

The content of nitrogen atoms in components (A) and (B) combined, should be 1.5 to 20% by weight based on the weight of epoxy resin (A) and phenolic resin curing agent (B) combined. A nitrogen content of less than 1.5 wt % fails to achieve the desired flame retardant effects. A nitrogen content in excess of 20 wt % impedes molding of the composition because of an increased viscosity and detracts from moisture resistance and storage stability. An appropriate nitrogen content is 1.5 to 15%, and especially 2 to 8% by weight based on components (A) and (B) combined.

The epoxy resin composition of the invention contains a molybdenum compound as the flame retardant (C). The molybdenum compound by itself is known to have a smoke-reducing and charring effect in burning plastics. Although like antimony trioxide, molybdenum compounds are conventionally used in combination with halogenated resins, flame retardance Is exerted by combining molybdenum compounds with the epoxy resin and the phenolic resin. Since the molybdenum compounds are free from powder toxicity as found with antimony trioxide, they are quite safe flame retardants.

Exemplary molybdenum compounds are molybdenum borides, molybdenum suicides such as molybdenum disilicide, molybdenum acetylacetonate, molybdenum oxides including molybdenum (IV) oxide, molybdenum (V) oxide, molybdenum (VI) oxide, zinc molybdate, calcium molybdate carbonate, and calcium molybdate, molybdenum esters, and molybdic salts as well as the foregoing molybdenum compounds supported on inorganic fillers. Of these, zinc molybdate is preferred since it does not affect the curability of the epoxy resin. Zinc molybdate on inorganic filler is most preferred.

To achieve a satisfactory flame retardant effect, the molybdenum compound, typically zinc molybdate must be uniformly dispersed in the epoxy resin composition. To improve the dispersibility, the molybdenum compound is preferably supported on an inorganic filler such as silica or talc prior to blending. Suitable inorganic tillers for supporting the molybdenum compound include silicas such as spherical or fragmental fused silica and crystalline silica, talc, alumina, silicon nitride, aluminum nitride, boron nitride, titanium oxide, and glass fibers. The molybdenum compound-carrying powder should preferably have a mean particle diameter of 0.1 to 40 $\mu$m, more preferably 0.2 to 15 $\mu$m, and most preferably 0.5 to 5 $\mu$m and a specific surface area of 0.5 to 50 m$^2$/g, and more preferably 0.7 to 10 m$^2$/g as measured by the BET adsorption method. It is noted that the mean particle diameter can be determined as the weight average value (or median diameter) based on the laser light diffraction technique, for example.

In the flame retardant comprising the molybdenum compound (typically zinc molybdate) supported on the inorganic filler, the content of molybdenum compound is preferably 2 to 50% by weight, more preferably 5 to 40% by weight, and especially 10 to 30% by weight. Less contents of molybdenum compound may fail to provide satisfactory flame retardance whereas excessive contents may detract from flow during molding and curability.

The zinc molybdate on inorganic filler is commercially available under the trade name of KEMGARD series, such as KEMGARD 1260, 1261, 1270, 1271 and 911C from Sherwin-Williams Co.

The amount of the flame retardant (C) in the form of molybdenum compound (typically zinc molybdate) on inorganic filler may be determined as appropriate although it is preferably 5 to 50 parts by weight per 100 parts by weight of the epoxy resin (A) and the phenolic resin curing agent (B) combined. The amount of molybdenum compound alone in the flame retardant (when the molybdenum compound is blended without supporting it on an inorganic carrier, the amount of the molybdenum compound itself) is preferably 0.3 to 20 parts, more preferably 0.6 to 10 parts, and especially 0.8 to 10 parts by weight per 100 parts by weight of the epoxy resin (A) and the phenolic resin curing agent (B) combined. Less amounts may fail to provide satisfactory to flame retardance whereas excessive amounts may detract from the flow and curability of the composition.

The inorganic filler (D), excluding the optional inorganic filler in component (C), included in the epoxy resin compositions of the invention may be any suitable inorganic filler commonly used in epoxy resin compositions. Illustrative examples include silicas such as spherical or fragmental fused silica and crystalline silica, alumina, silicon nitride, aluminum nitride, boron nitride, titanium oxide, and glass fibers. No particular limit is imposed on the mean particle diameter and shape of the inorganic fillers, although a mean particle diameter of about 0.5 to 40 $\mu$m, and especially about 1 to 20 $\mu$m is preferred. The use of spherical fused silica is especially preferred.

An appropriate amount of the inorganic filler (D) is 300 to 900 parts by weight per 100 parts by weight of the epoxy resin (A) and the phenolic resin curing agent (B) combined. Less than 300 parts of the inorganic filler fails to achieve the desired flame retarding effects whereas more than 900 parts detracts from flow.

The inorganic filler used herein is preferably surface treated beforehand with a coupling agent such as a silane coupling agent or a titanate coupling agent in order to increase the bond strength between the resin and the inorganic filler. Preferred examples of such coupling agents include epoxy functional group-containing alkoxysilanes such as $\gamma$-glycidoxypropyltrimethoxysilane, $\gamma$-glycidoxypropylmethyldiethoxysilane, and $\beta$-(3,4-epoxycyclohexyl)ethyltrimethoxysilane; amino functional group-containing alkoxysilanes such as N-$\gamma$-(aminoethyl)-$\gamma$-aminopropyltrimethoxysilane, $\gamma$-aminopropyltriethoxysilane, and N-phenyl-$\gamma$-aminopropyltrimethoxysilane; and mercapto functional group-containing alkoxysilanes such as $\gamma$-mercaptotrimethoxysilane. No particular limitation is imposed on the amount of coupling agent used for surface treatment or the method of surface treatment.

In the practice of this invention, use is preferably made of a curing accelerator to promote the curing reaction between the epoxy resin (A) and the curing agent (B). The curing accelerator may be any suitable substance that promotes the curing reaction. Illustrative, non-limiting examples of curing accelerators that may be used include organic phosphorus compounds such as triphenylphosphine, tributylphosphine, tri(p-methylphenyl)phosphine, tri(nonylphenyl)phosphine, triphenylphosphine triphenylborane, and tetraphenylphosphonium tetraphenylborate; tertiary amine compounds such as triethylamine, benzyldimethylamine, $\alpha$-methylbenzyldimethylamine, and 1,8-diazabicyclo[5.4.0]undecene-7; and imidazole compounds such as 2-methylimidazole, 2-phenylinidazole, and 2-phenyl-4-methylimidazole.

The semiconductor encapsulating epoxy resin compositions of the invention may also include various additives, if necessary. Illustrative examples include stress-lowering additives such as nitrogen atom-containing thermoplastic resins, nitrogen atom-containing thermosetting resins, thermoplastic resins, thermoplastic elastomers, and synthetic organic rubbers; waxes such as carnauba wax, higher fatty acids, and synthetic waxes; colorants such as carbon black; and halogen trapping agents.

The inventive epoxy resin compositions is generally prepared by compounding the epoxy resin, phenolic resin curing agent, molybdenum compound, inorganic filler, and other components in predetermined proportions, intimately mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by postcuring at about 150 to 180° C. for about 2 to 16 hours.

The semiconductor encapsulating epoxy resin compositions of the invention cure into products which have an excellent fire retardance and high-temperature capabilities. Owing to the absence of harmful materials such as halogenated epoxy resins and antimony compounds (e.g., antimony trioxide), the epoxy resin compositions have no adverse impact on human health or the environment.

EXAMPLE

Examples of the invention and comparative examples are given below by way of illustration, and are not intended to limit the invention. All parts are by weight.

Examples 1–6 and Comparative Examples 1–3

Epoxy resin compositions for semiconductor encapsulation were prepared by uniformly melt mixing the components shown in Table 1 in a hot twin-roll mill, followed by cooling and grinding.

Properties of these compositions were measured by the following methods. The results are shown in Table 2.

(1) Spiral Flow:

Measured by molding at 175° C. and 6.86 MPa for a molding time of 90 seconds using a mold in accordance with EMMI standards.

(2) Hardness when Molded:

Using the method described in JIS-K6911, a rod measuring 10×4×100 mm was molded at 175° C. and 6.86 MPa for a time of 90 seconds. The hardness when hot was measured with a Barcol Impressor.

(3) Flame Retardance

A 1/16 inch thick sheet was molded and its flame retardance was rated in accordance with UL-94 test specifications.

(4) High-temperature Capability

A simulated element in the form of a silicon chip having aluminum wiring formed thereon was bonded to a partially gold-plated 42 Alloy lead frame using gold wire with a diameter of 30 μm. The epoxy resin composition was then molded over the element at 175° C. and 6.86 MPa for a time of 120 seconds, and post-cured at 180° C. for 4 hours, forming a 14-pin DIP. The package was left to stand for 500 hours in a drier at 200° C. The cured resin was dissolved away using fuming nitric acid. The tensile strength of the bond on the chip side. Those samples in which the tensile strength after the test decreased below 50% of the initial value are rejected. The number of rejected samples per 20 samples is reported.

TABLE 1

| Component (pbw) | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Epoxy resin (a) | 57.6 | 57.6 | 45.9 | 45.9 | 57.8 | 57.4 | 58.2 | 41.1 | 54.4 |
| Curing agent (b) | 21.2 | 21.2 | — | — | — | — | 16.7 | — | — |
| Curing agent (c) | — | — | 54.1 | 54.1 | — | — | — | 58.9 | — |
| Curing agent (d) | — | — | — | — | 42.2 | — | — | — | — |
| Curing agent (e) | — | — | — | — | — | 42.7 | — | — | — |
| Curing agent (f) | 21.2 | 21.2 | — | — | — | — | 25.1 | — | 39.4 |
| Nitrogen content* | 1.7 | 1.7 | 19 | 19 | 3.4 | 5.1 | 1.3 | 21 | 0 |
| Inorganic filler | 500 | 695 | 500 | 695 | 600 | 600 | 500 | 500 | 500 |
| Curing accelerator | 1.2 | 1.2 | 1.2 | 1.2 | 1.2 | 1.2 | 1.2 | 1.2 | 1.2 |
| KEMGARD 1261 | 50 | 5 | 50 | 5 | 20 | 20 | 50 | 50 | — |
| Net amoumt of zinc molybdate from flame retardant | 9 | 0.9 | 9 | 0.9 | 3.6 | 3.6 | 9 | 9 | — |
| Antimony trioxide | — | — | — | — | — | — | — | — | 4 |
| Brominated novolac epoxy resin | — | — | — | — | — | — | — | — | 6.2 |
| Parting agent | 3 | 3 | 3 | 3 | 3 | 3 | 3 | 3 | 3 |
| Carbon black | 2 | 2 | 2 | 2 | 2 | 2 | 2 | 2 | 2 |
| Silane coupling agent | 1 | 1 | 1 | 1 | 1 | 1 | 1 | 1 | 1 |

*The content of nitrogen atoms contained in the entire composition is expressed in percent by weight based on the weight of epoxy resin (A) and phenolic resin curing agent (B) combined.

Epoxy resin (a):
    o-cresol novolac epoxy resin: EOCN 1020-55 by Nippon Kayaku K.K. (epoxy equivalent 200)
Curing agent (b):
    phenol novolac resin having benzoguanamine skeleton represented by formula (7) (nitrogen atom content 8 wt %, softening point 94° C., phenolic hydroxyl equivalent 130)

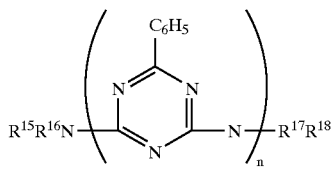
(7)

In formula (7), $R^{15}$, $R^{16}$, $R^{17}$, and $R^{18}$ are hydrogen or a phenol novolac resin having one free valence bond, with the proviso that at least one of $R^{15}$, $R^{16}$, $R^{17}$, and $R^{18}$ is a phenol novolac resin having one free valence bond, and n is an integer of 1 to 10 selected so as to give the phenolic hydroxyl equivalent of (b) and (c).

Curing agent (c):
 phenol novolac resin having benzoguanamine skeleton represented by formula (7) (nitrogen atom content 35 wt %, softening point 127° C., phenolic hydroxyl equivalent 165)

Curing agent (d):
 phenolic resin having melamine skeleton represented by formula (8) (nitrogen atom content 8 wt %, softening point 90° C., phenolic hydroxyl equivalent 117)

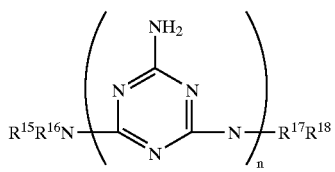
(8)

In formula (8), $R^{15}$, $R^{16}$, $R^{17}$, and $R^{18}$ are hydrogen or a phenol novolac resin having one free valence bond, with the proviso that at least one of $R^{15}$, $R^{16}$, $R^{17}$, and $R^{18}$ is a phenol novolac resin having one free valence bond, and n is an integer of 1 to 10 selected so as to give the phenolic hydroxyl equivalent prescribed above.

Curing agent (e):

phenolic resin represented by formula (9) (nitrogen atom content 12 wt %, softening point 119° C., hydroxyl equivalent 119)

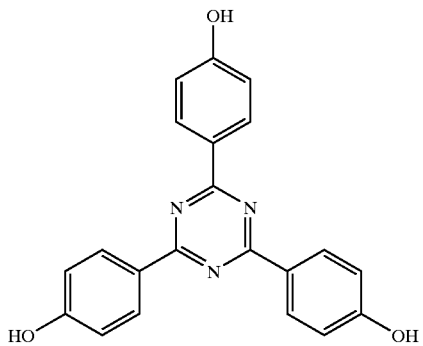
(9)

Curing agent (f):
 phenol novolac resin DL-92 by Meiwa Kasei K.K. (hydroxyl equivalent 110)

KEMGARD 1260:
 Zinc molybdate on inorganic filler (zinc molybdate content 18 wt %, inorganic filler: spherical silica with a mean particle size 0.5 μm and a specific surface area 5.5 m²/g) by Sherwin-Williams Co.

Inorganic filler:
 Spherical fused silica (mean particle size 15 μm) by Tatsumori K.K.

Curing accelerator:
 triphenyl phosphine by Hokko Chemical K.K.

Parting agent:
 Carnauba wax by Nikko Fine Products K.K.

Silane coupling agent:
 KBM403 (γ-glycidoxypropyltrimethoxysilane) by Shin-Etsu Chemical Co., Ltd.

TABLE 2

| | Example | | | | | | Comparative Example | | |
| --- | --- | --- | --- | --- | --- | --- | --- | --- | --- |
| | 1 | 2 | 3 | 4 | 5 | 6 | 1 | 2 | 3 |
| Spiral flow (cm) | 70 | 80 | 73 | 70 | 85 | 80 | 83 | 35 | 70 |
| Moldability | OK | OK | OK | OK | OK | OK | OK | NG | NG |
| Hardness when molded | 75 | 78 | 78 | 82 | 82 | 85 | 73 | 90 | 35 |
| Flame retardance | V-0 | V-0 | V-0 | V-0 | V-0 | V-0 | burned | V-0 | V-0 |
| High temperature capability | 0/20 | 0/20 | 0/20 | 0/20 | 0/20 | 0/20 | 0/20 | 0/20 | 0/20 |

From Table 2, it is evident that the semiconductor encapsulating epoxy resin compositions of the invention are able to cure into products which have excellent flame retardance and high-temperature capabilities. The compositions have no ill effects on human health and the environment because they contain no halogenated epoxy resins or antimony trioxide.

Japanese Patent Application No. 2000-183054 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition comprising
   (A) an epoxy resin,
   (B) a phenolic resin curing agent,
   (C) a molybdenum compound, and
   (D) 300 to 900 parts by weight per 100 parts by weight of components (A) and (B) combined of an inorganic filler,
   wherein nitrogen atoms are contained in component (A) and/or component (B) in an amount of 1.5 to 20% by weight based on the weight of components (A) and (B) combined.

2. The epoxy resin composition of claim 1 wherein component (B) is a phenolic resin containing nitrogen atoms in its skeleton in the form of a triazine ring structure, guanamine skeleton or cyanurate skeleton.

3. The epoxy resin composition of claim 1 wherein component (A) is an epoxy resin containing nitrogen atoms in its skeleton in the form of a triazine ring structure, guanamine skeleton or cyanurate skeleton.

4. The epoxy resin composition of claim 1 wherein the molybdenum compound (C) is zinc molybdate.

5. The epoxy resin composition of claim 2 wherein the molybdenum compound (C) is zinc molybdate supported on an inorganic filler.

6. A semiconductor device encapsulated with a cured product of the epoxy resin composition of claim 1.

7. A semiconductor encapsulating epoxy resin composition comprising (A) an epoxy resin, (B) a phenolic resin curing agent, (C) a molybdenum compound, and (D) 300 to 900 parts by weight per 100 parts by weight of components (A) and (B) combined of an inorganic filler,
   wherein nitrogen atoms are contained in component (B) in an amount of 2 to 8 weight-% based on the weight of components (A) and (B) combined.

8. A semiconductor device encapsulated with a cured product of the epoxy resin composition of claim 7.

9. A method of improving the balance between flame retardance and hardness in a molded semiconductor encapsulating resin composition, which method comprises the step of formulating said composition to comprise (A) an epoxy resin, (B) a phenolic resin curing agent, (C) a molybdenum compound, and (D) 300 to 900 parts by weight per 100 parts by weight of components (A) and (B) combined of an inorganic filler, provided that nitrogen atoms are contained in component (B) in an amount of 1.5 to 20 weight-% based on the weight of components (A) and (B) combined.

10. The method of claim 9, wherein the flame retardance of said molded composition when rated in accordance with UL-94 test specification is V-0 and wherein the hardness of said molded composition when measured in accordance with the method described in JIS-K6911 ranges from 75 to 85.

11. A semiconductor encapsulating epoxy resin composition comprising:
    (A) an epoxy resin,
    (B) a phenolic curing agent selected from the group consisting of (i) a phenol novolac resin having a benzoguanamine skeleton represented by the formula (7),

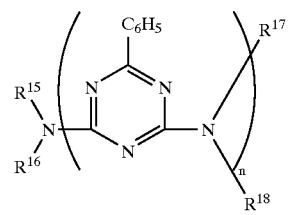

wherein $R^{15}$, $R^{16}$, $R^{17}$, and $R^{18}$ are hydrogen or a phenol novolac resin having one free valence bond, with the proviso that at least one of $R^{15}$, $R^{16}$, $R^{17}$, and $R^{18}$ is a phenol novolac resin having one free valence bond, and n is an integer of 1 to 10 selected so as to give a phenolic hydroxyl equivalent of 130 or 165, (ii) a phenol novolac resin having a melamine skeleton represented by the formula (8)

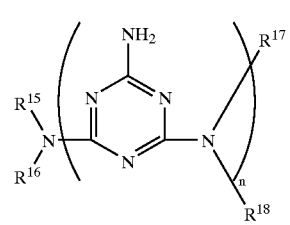

wherein $R^{15}$, $R^{16}$, $R^{17}$, and $R^{18}$ are hydrogen or a phenol novolac resin having one free valence bond, with the proviso that at least one of $R^{15}$, $R^{16}$, $R^{17}$, and $R^{18}$ is a phenol novolac resin having one free valence bond, and n is an integer of 1 to 10 selected so as to give a phenolic hydroxyl equivalent of 117, and (iii) a phenolic resin represented by the formula

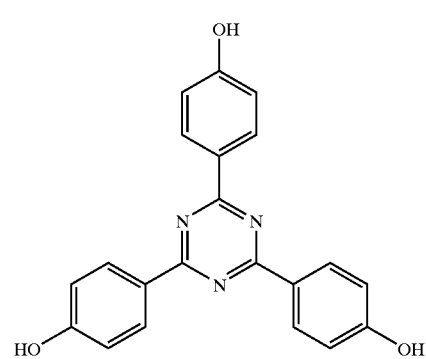

(C) a molybdenum compound, and
(D) 300 to 900 parts by weight per 100 parts by weight of components (A) and (B) combined of an inorganic filler,
wherein nitrogen atoms are contained in component (A) and/or component (B) in an amount of 1.5 to 20% by weight based on the weights of component (A) and (B) combined.

12. The epoxy resin composition of claim 1 wherein the molybdenum compound (C) is zinc molybdate supported on an inorganic filler.

13. A semiconductor device encapsulated with a cured product of the epoxy resin composition of claim 11.

* * * * *